US010304930B2

(12) United States Patent
Ohse et al.

(10) Patent No.: US 10,304,930 B2
(45) Date of Patent: May 28, 2019

(54) SEMICONDUCTOR DEVICE IMPLANTED WITH ARSENIC AND NITROGEN (71) Applicant: FUJI ELECTRIC CO., LTD., Kawasaki-shi, Kanagawa (JP)

(72) Inventors: Naoyuki Ohse, Matsumoto (JP); Makoto Utsumi, Matsumoto (JP); Yasuhiko Oonishi, Matsumoto (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 4 days.

(21) Appl. No.: 15/796,896

(22) Filed: Oct. 30, 2017

(65) Prior Publication Data
US 2018/0138271 A1    May 17, 2018

(30) Foreign Application Priority Data
Nov. 16, 2016  (JP) ................. 2016-223538

(51) Int. Cl.
H01L 29/10 (2006.01)
H01L 29/78 (2006.01)
H01L 21/265 (2006.01)
H01L 29/66 (2006.01)
H01L 29/36 (2006.01)
(Continued)

(52) U.S. Cl.
CPC ........ H01L 29/1095 (2013.01); H01L 21/046 (2013.01); H01L 21/26513 (2013.01); H01L 29/36 (2013.01); H01L 29/66734 (2013.01); H01L 29/7813 (2013.01); H01L 29/7397 (2013.01)

(58) Field of Classification Search
CPC ........ H01L 29/36; H01L 21/22; H01L 29/086
See application file for complete search history.

(56) References Cited

U.S. PATENT DOCUMENTS 5,923,070 A * 7/1999 Yamada ............. H01L 29/6659
257/384
6,225,151 B1 * 5/2001 Gardner ............ H01L 21/26586
438/162
(Continued)

FOREIGN PATENT DOCUMENTS

JP    2014-236120 A    12/2014

Primary Examiner — Lex H Malsawma
Assistant Examiner — Laura M Dykes
(74) Attorney, Agent, or Firm — Rabin & Berdo, P.C.

(57) ABSTRACT

In forming an $n^+$-type source region in a surface region of a p-type base layer by ion implantation, ion implantation of arsenic and ion implantation of nitrogen are sequentially performed. The ion implantation of nitrogen is performed by acceleration energy higher than that of the ion implantation of arsenic. The $n^+$-type source region has an arsenic concentration profile and a nitrogen concentration profile formed to overlap each other at a different depth from the front surface of the base substrate. A peak of the nitrogen concentration profile is positioned deeper than a peak of the arsenic concentration profile from the front surface of the base substrate. The overall impurity concentration distribution of the $n^+$-type source region is a concentration profile that is formed by summing the arsenic concentration profile and the nitrogen concentration profile with each other and whose diffusion depth is large.

5 Claims, 6 Drawing Sheets

(51) Int. Cl.
*H01L 21/04* (2006.01)
*H01L 29/739* (2006.01)

(56) References Cited

U.S. PATENT DOCUMENTS

| | | | |
|---|---|---|---|
| 2005/0062048 A1* | 3/2005 | Hayashi | H01L 29/66068 257/77 |
| 2005/0148128 A1* | 7/2005 | Pattanayak | H01L 29/7813 438/197 |
| 2014/0353683 A1 | 12/2014 | Ishimabushi et al. | |

* cited by examiner

SEMICONDUCTOR DEVICE IMPLANTED WITH ARSENIC AND NITROGEN

CROSS REFERENCE TO RELATED APPLICATIONS

This application is based upon and claims the benefit of priority of the prior Japanese Patent Application No. 2016-223538, filed on Nov. 16, 2016, the entire contents of which are incorporated herein by reference.

BACKGROUND OF THE INVENTION

1. Field of the Invention

Embodiments of the invention relate to a semiconductor device and a method of manufacturing a semiconductor device.

2. Description of the Related Art

Silicon carbide (SiC) has favorable attributes including low on-resistance, high speed characteristics, and high temperature characteristics and therefore, its application to power devices is particularly expected. A vertical MOS power device driven by a MOS gate (an insulated gate including a metal oxide film semiconductor) has been proposed as a semiconductor device that uses silicon carbide. A trench gate structure embedded in a trench formed in a semiconductor substrate is known as the MOS gate structure of the vertical MOS power device. The trench gate structure is suitable for size reductions in a lateral direction (a direction perpendicular to a depth direction of the element), that is, reduction of the cell pitch, and the low on-resistance property may easily be achieved with this structure.

Figure 10:
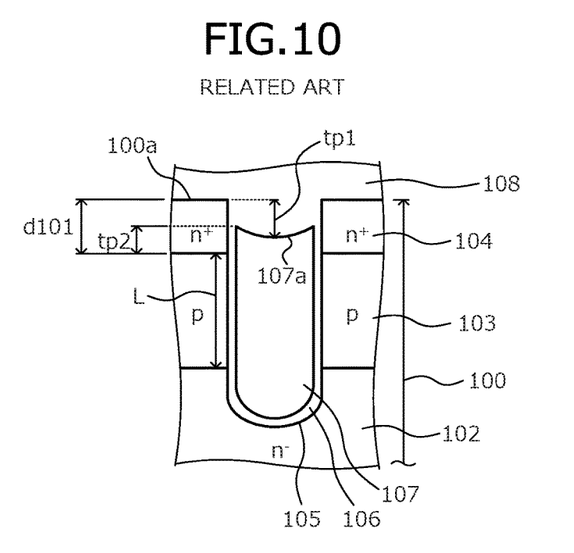
FIG. 10 is a cross-sectional view of a structure near a trench of an ordinary vertical MOSFET.

FIG. 10 depicts a structure near a trench of an ordinary vertical metal oxide semiconductor field effect transistor (MOSFET). FIG. 10 is a cross-sectional view of the structure near the trench of the ordinary vertical MOSFET. The trench gate structure is usually formed by forming a gate insulating film 106 along an inner wall of a trench 105 and then filling the trench 105 with polysilicon (poly-Si) to form a gate electrode 107. In this case, when the gate electrode 107 (polysilicon) is etched back to planarize the element surface (chip surface), the gate electrode 107 drops into the trench 105.

Therefore, to ensure a margin for the etching back relative to a drop amount of the gate electrode 107 in the trench 105 (hereinafter, referred to as "gate drop amount") tp1, an $n^+$-type source region 104 having a diffusion depth d101 that is large is formed. Formation of the $n^+$-type source region 104 by ion implantation of an n-type impurity that easily diffuses such as phosphorus (P) or nitrogen (N) is known to increase the diffusion depth d101. Reference numerals "102" and "103" respectively denote an $n^-$-type drift layer and a p-type base layer that are sequentially formed by epitaxial growth on an $n^+$-type supporting substrate not depicted including silicon carbide to be an $n^+$-type drain layer.

According to a method proposed as a method of manufacturing a vertical MOSFET having the trench structure, at a process to form an n-type source region, a dose amount of an impurity used when the implantation energy is maximal in multi-stage ion implantation is set to be smaller than a dose amount of an impurity used when the implantation energy is not maximal (see, e.g., Japanese Laid-Open Patent Publication No. 2014-236120). In Japanese Laid-Open Patent Publication No. 2014-236120, variation of the channel length, the gate threshold voltage, and the on-resistance is suppressed by suppressing variation of the junction depth of a pn-junction between a p-type base region and the n-type source region by suppressing the channeling of an n-type impurity in a deep portion in the n-type source region. Any one impurity among nitrogen (N), phosphorus (P), and arsenic (As) is used as the dopant in the ion implantation to form the n-type source region.

SUMMARY OF THE INVENTION

According to one embodiment of the invention, a semiconductor device includes a semiconductor substrate; a first semiconductor layer of a first conductivity type provided on a front surface of the semiconductor substrate; a second semiconductor layer of a second conductivity type provided on a surface on a first side of the first semiconductor layer opposite a second side of the first semiconductor layer facing the semiconductor substrate; a semiconductor region of the first conductivity type selectively provided in the second semiconductor layer; a trench that penetrates the semiconductor region of the first conductivity type and the second semiconductor layer to reach the first semiconductor layer; a gate electrode provided in the trench, on a gate insulating film; a first electrode contacting the semiconductor region of the first conductivity type and the second semiconductor layer; and a second electrode provided on a rear surface of the semiconductor substrate. The semiconductor device has a first impurity concentration distribution of arsenic in a region on a side of the first electrode, and a second impurity concentration distribution of nitrogen overlapping the first impurity concentration distribution in a region of the semiconductor region of the first conductivity type closer than the first impurity concentration distribution to the second electrode.

In the embodiment, a peak of the second impurity concentration distribution is positioned closer than a peak of the first impurity concentration distribution to the second electrode.

In the embodiment, a negative slope of an impurity concentration from the peak of the second impurity concentration distribution toward the second electrode is steeper than a negative slope of an impurity concentration from the peak of the first impurity concentration distribution toward the second electrode.

According to an embodiment of the present invention, a method of manufacturing a semiconductor device includes forming a first semiconductor layer of a first conductivity type on a front surface of a semiconductor substrate; forming a second semiconductor layer of a second conductivity type on a surface on a first side of the first semiconductor layer opposite a second side of the first semiconductor layer facing the semiconductor substrate; selectively forming a semiconductor region of the first conductivity type in the second semiconductor layer by a first ion implantation of arsenic and a second ion implantation of nitrogen; forming a trench that penetrates the semiconductor region of the first conductivity type and the second semiconductor layer to reach the first semiconductor layer; forming a gate electrode in the trench, on a gate insulating film; forming a first electrode contacting the semiconductor region of the first conductivity type and the second semiconductor layer; and forming a second electrode on a rear surface of the semiconductor substrate. A first impurity concentration distribution of the arsenic is formed in a region on a side of the first electrode of the semiconductor region of the first conductivity type by the first ion implantation. A second impurity concentration distribution of nitrogen is formed by the second ion implantation to overlap the first impurity concentration distribution, in a region closer than the first impurity concentration distribution of the semiconductor region of the first conductivity type to the second electrode.

Objects, features, and advantages of the present invention are specifically set forth in or will become apparent from the following detailed description of the invention when read in conjunction with the accompanying drawings.

DETAILED DESCRIPTION OF THE INVENTION

First, problems related to the conventional techniques above will be described. As described above, a leak (a leak current) in a vertical direction (the depth direction of the element may not be suppressed when the $n^+$-type source region 104 is formed by ion implantation of phosphorus. When the $n^+$-type source region 104 is formed by ion implantation of nitrogen, the contact resistance with a metal electrode (a source electrode) not depicted cannot be reduced. These problems may be solved by forming the $n^+$-type source region by ion implantation of arsenic. Arsenic, however, has a large atomic radius and therefore, is non-diffusible. This causes a new problem in that the diffusion depth d101 of the $n^+$-type source region 104 becomes shallow.

When the diffusion depth d101 of the $n^+$-type source region 104 is shallow, the margin of the etching back relative to the gate drop amount tp1 is narrow. Therefore, a thickness tp2 of a portion of the $n^+$-type source region 104 facing the gate electrode 107 across the gate insulating film 106 may not be secured, leading to reduction of the yield. When the diffusion depth d101 of the $n^+$-type source region 104 is shallow, it is difficult to secure the control margin of the channel length L against variation of the thickness of the epitaxial layer (the p-type base layer 103), unevenness created by sacrificial oxidation on a front surface 100a of a semiconductor base substrate 100, and the like.

The acceleration energy of the ion implantation only is increased to increase the diffusion depth of the $n^+$-type source region 104 formed by the ion implantation of arsenic. However, the maximal acceleration energy of an ordinary ion implantation apparatus is about 350 keV to 400 keV and as a result, the arsenic ions cannot be accelerated so that the energy thereof reaches the level necessary for forming the $n^+$-type source region 104 to have a large diffusion depth d101. Although an ion implantation apparatus capable of implanting the ions with high acceleration energy may be used, this apparatus is expensive and the throughput decreases. A problem, therefore, arises in that mass production is poor.

Embodiments of a semiconductor device and a method of manufacturing a semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described.

Figure 1:
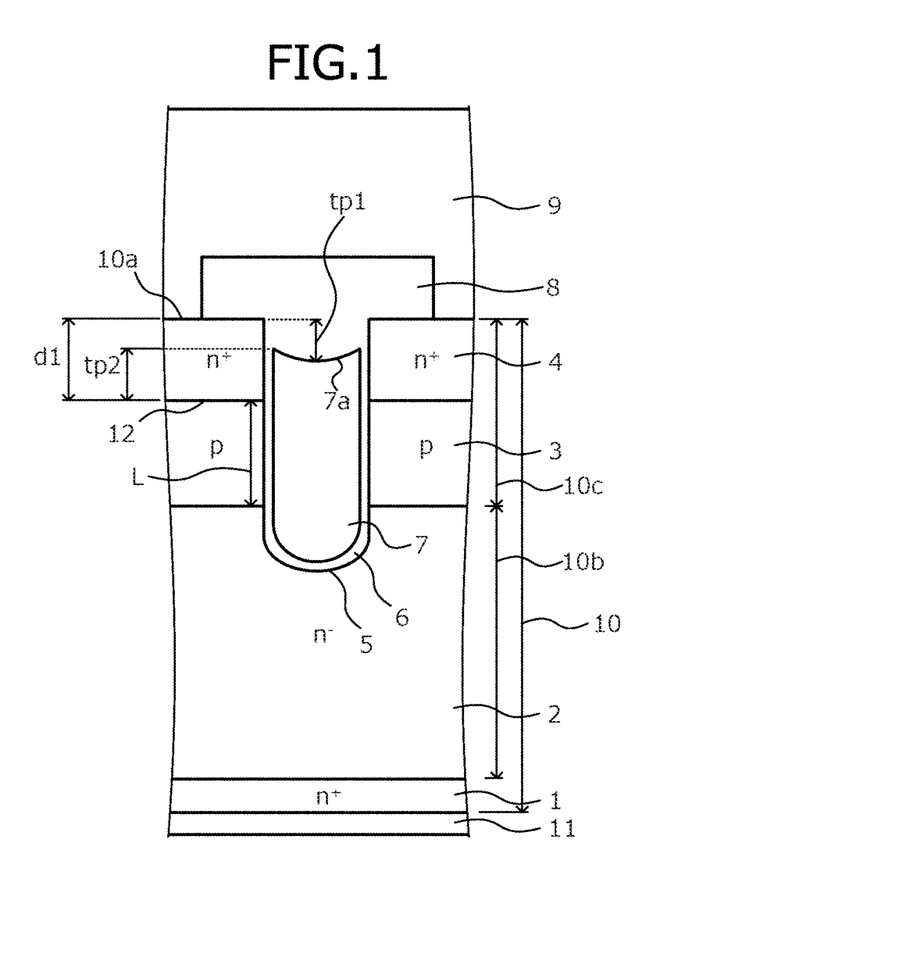
FIG. 1 is a cross-sectional view of a structure of a semiconductor device according to a first embodiment.

A structure of the semiconductor device according to a first embodiment will be described taking an example of a vertical MOSFET using silicon carbide (hereinafter, referred to as "SiC-MOSFET"). FIG. 1 is a cross-sectional view of a structure of the semiconductor device according to the first embodiment. The semiconductor device depicted in FIG. 1 is a SiC-MOSFET having a MOS gate (an insulated gate including a metal oxide semiconductor) structure in a front surface (the face on the side of a p-type base layer 3) 10a of a silicon carbide base substrate 10. The silicon carbide base substrate 10 is an epitaxial substrate formed by sequentially forming epitaxial layers (silicon carbide layers) 10b and 10c to be an $n^-$-type drift layer (a first semiconductor layer) 2 and the p-type base layer (a second semiconductor layer) 3, on an $n^+$-type supporting substrate including silicon carbide (hereinafter, referred to as "$n^+$-type silicon carbide substrate" (a semiconductor chip) 1. FIG. 1 depicts one unit cell including one MOS gate (a function unit of the element).

The MOS gate structure includes the p-type base layer 3, an $n^+$-type source region (a semiconductor region of the first conductivity type) 4, a $p^+$-type contact region not depicted, a trench 5, a gate insulating film 6, and a gate electrode 7. The $n^-$-type drift layer 2 includes the $n^-$-type epitaxial layer 10b. The $n^+$-type source region 4 is provided in a surface region of the p-type epitaxial layer 10c (a region on the front surface 10a side of the base substrate) spanning between the side walls of the adjacent trenches 5. The $n^+$-type source region 4 is the diffusion region of arsenic (As) doping and nitrogen (N) doping and has a diffusion depth d1 that is deeper than that in a case of arsenic alone. The impurity concentration distribution in the $n^+$-type source region 4 will be described later. The $p^+$-type contact region is selectively provided in the surface region of the p-type epitaxial layer 10c. Other than the $n^+$-type source region 4 and the $p^+$-type contact region, a portion of the p-type epitaxial layer 10c is the p-type base region 3. The trench 5 penetrates the $n^+$-type source region 4 and the p-type base layer 3 to reach the $n^-$-type drift layer 2.

The gate insulating film 6 is provided along the inner wall of the trench 5. The trench 5 is filled with, for example, polysilicon (poly-Si) that becomes the gate electrode 7 on the gate insulating film 6. The gate electrode 7 is dropped into the trench 5 by etching back described later. The dropping of the gate electrode 7 in the trench 5 means that an interface between the gate electrode 7 and an interlayer insulating film 8 is positioned inside the trench 5. FIG. 1 depicts a drop amount (a gate drop amount) of the gate electrode 7 in the trench 5 denoted by reference numeral "tp1". The gate drop amount tp1 is a distance from the front surface 10a of the silicon carbide base substrate 10 (the surface of the n+-type source region 4) to an end portion of the gate electrode 7 in contact with the gate insulating film (i.e., d1−tp2) (the depth).

The interlayer insulating film 8 is provided on the front surface 10a of the silicon carbide base substrate 10 so as to fill an upper half portion of the trench 5. The n+-type source region 4 and the p+-type contact region are exposed in a contact hole that penetrates the interlayer insulating film 8 in the depth direction. The source electrode (a first electrode) 9 is in contact with the n+-type source region 4 and the p+-type contact region through the contact hole. The source electrode 9 and the gate electrode 7 are electrically insulated from each other by the interlayer insulating film 8 that covers the gate electrode 7 embedded in the upper half portion of the trench 5. A drain electrode (a second electrode) 11 is provided on a rear surface of the silicon carbide base substrate 10 (the rear surface of the n+-type silicon carbide base substrate 1 that is an n+-type drain region).

Figure 2:
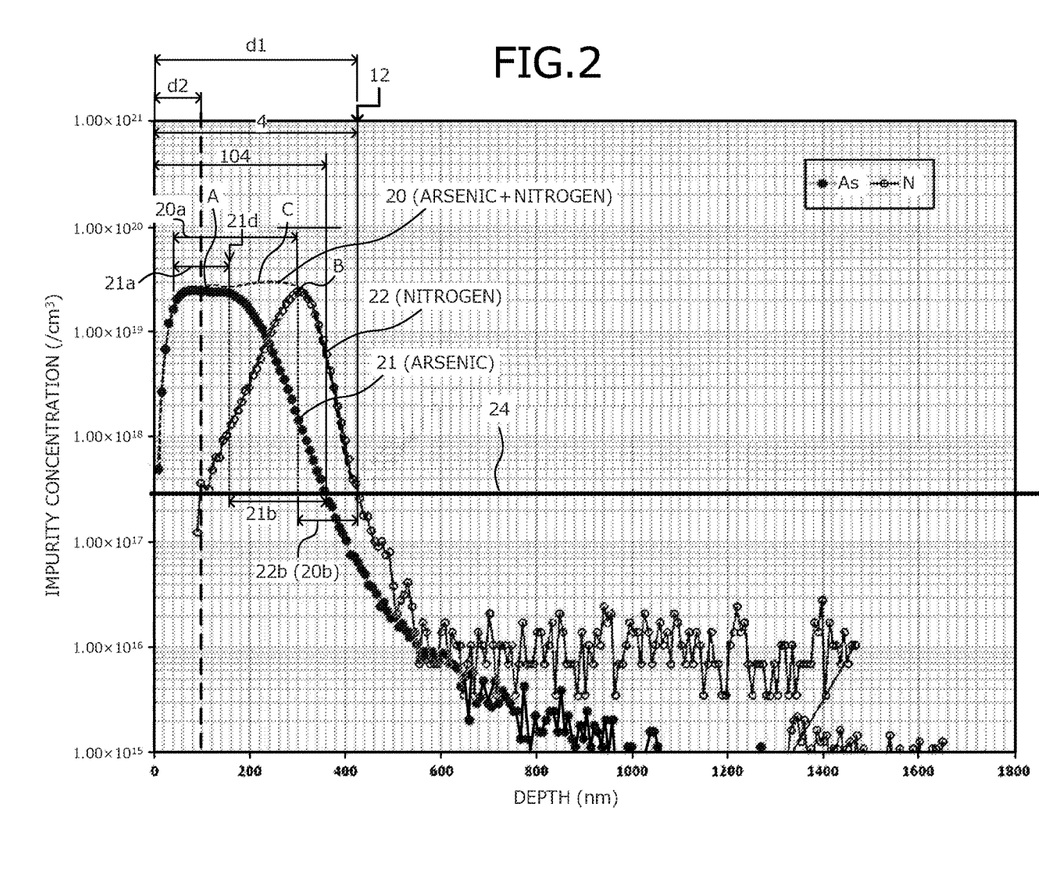
FIG. 2 is a characteristics diagram of impurity concentration distributions of a main part of the semiconductor device according to the first embodiment.

The impurity concentration distribution in the n+-type source region 4 will be described. FIG. 2 is a characteristics diagram of the impurity concentration distributions of a main part of the semiconductor device according to the first embodiment. FIG. 2 depicts impurity concentration distributions in the n+-type source region 4 of the arsenic doping and the nitrogen doping in FIG. 1. In FIG. 2, "the depth=0 nm" refers to the front surface 10a of the silicon carbide base substrate 10, i.e., the interface between the source electrode 9 and the n+-type source region 4. As depicted in FIG. 2, the n+-type source region 4 includes the impurity concentration distribution of arsenic (hereinafter, referred to as "arsenic concentration profile" (a first impurity concentration distribution)) 21 and the impurity concentration distribution of nitrogen (hereinafter, referred to as "nitrogen concentration profile" (a second impurity concentration distribution)) 22 each at a depth different from that of each other from the front surface 10a of the base substrate 10. The overall impurity concentration distribution 20 in the n+-type source region 4 is the concentration profile formed by summing the arsenic concentration profile 21 and the nitrogen concentration profile 22 each formed to overlap each other in different depth ranges.

For example, a surface region (a region on the source electrode 9 side) of the n+-type source region 4 is a region in which arsenic is doped at a predetermined impurity concentration to form the arsenic concentration profile 21. The arsenic concentration profile 21 in the n+-type source region 4 presents a concentration profile having a mild mountain-like shape that has a peak (the maximum) A distributed substantially flatly spanning in a relatively wide depth range 21a at a relatively shallow position from the front surface 10a of the base substrate. The arsenic concentration profile 21 may be formed by, for example, ion implantation in multiple stages (plural sessions) of differing acceleration energies (hereinafter, referred to as "multi-stage ion implantation"). The contact resistance with the source electrode 9 may be reduced and ohmic contact with the source electrode 9 may be achieved by setting the concentration of arsenic in the surface region of the n+-type source region 4 to be, for example, about $1 \times 10^{20}/cm^3$.

A relatively deep region of the n+-type source region 4 (a region on the drain electrode 11 side) is a region in which nitrogen is doped at a predetermined impurity concentration to form the nitrogen concentration profile 22. The nitrogen concentration profile 22 of the n+-type source region 4 presents a concentration profile having a steep mountain-like shape peaking at substantially one point at a position deeper than the peak A of the arsenic concentration profile 21, forming a peak B. The nitrogen concentration profile 22 may be formed by executing ion implantation of nitrogen at an acceleration energy, for example, higher than or equal to that of the ion implantation of arsenic. The overall impurity concentration distribution 20 of the n+-type source region 4 presents a concentration profile having a mild mountain-like shape that has a peak C distributed substantially flatly in a wide depth range 20a spanning from the peak A of the arsenic concentration profile 21 to the peak B of the nitrogen concentration profile 22. The diffusion depth d1 of the n+-type source region 4 becomes larger than that in a case where the n+-type source region 104 of the conventional structure (see FIG. 10) is formed by doping of arsenic alone (i.e., the n+-type source region 104 having only the arsenic concentration profile 21).

Even when an ordinary ion implantation apparatus is used, the diffusion depth d1 of the n+-type source region 4 may be controlled with precision by controlling the position of the peak B of the nitrogen concentration profile, and the predetermined diffusion depth d1 (e.g., about 350 nm) of the n+-type source region 4 may be achieved. Therefore, the margin of the etching back relative to the gate drop amount tp1 may be secured with precision and the thickness tp2 of the portion of the n+-type source region 4 facing the gate electrode 7 across the gate insulating film 6 may be secured to be a predetermined thickness. The margin of the etching back relative to the gate drop amount tp1 is the amount of increase of the gate drop amount tp1 permissible by the variation of the etching back of the gate electrode 7. Because the diffusion depth d1 of the n+-type source region 4 may be increased, the control margin of the channel length L may be secured with precision against variation of the thickness of the epitaxial layer 10c to be the p-type base layer 3, protrusions and recesses of the front surface 10a of the base substrate produced by sacrificial oxidation, and the like.

A negative slope of a portion 22b deeper than the peak B of the nitrogen concentration profile 22 of the n+-type source region 4 is steeper than a negative slope of the impurity concentration of a portion 21b deeper than the peak A of the arsenic concentration profile 21 of the n+-type source region 4. This results from the radius of the nitrogen atom being smaller than the radius of the arsenic atom. The portion 22b deeper than the peak B of the nitrogen concentration profile 22 of the n+-type source region 4 forms the concentration slope of a portion 20b deeper than the peak C of the overall impurity concentration distribution 20 of the n+-type source region 4. A negative slope of the impurity concentration of the portion 20b deeper than the peak C of the overall impurity concentration distribution 20 of the n+-type source region 4 is steep based on the nitrogen concentration profile 22 of the n+-type source region 4. A pn-junction 12 between the p-type base layer 3 and the n+-type source region 4 is formed at the depth at which the concentration slope of the overall impurity concentration distribution 20 of the n+-type source region 4 matches the impurity concentration of the p-type epitaxial layer 10c to be the p-type base layer 3 (a lateral line denoted by reference numeral "24"). Therefore, variation of the depth of the pn-junction 12 formed in the p-type epitaxial layer 10c may be further reduced by the negative slope of the impurity concentration in the portion 20b deeper than the peak C of the overall impurity concentration distribution 20 of the n+-type source region 4 becoming steep.

The impurity concentration of nitrogen in a portion of the surface region of the silicon carbide base substrate 10 (e.g., a portion from the front surface of the silicon carbide base substrate 10 to a depth d2 of about 100 nm) becoming a silicide layer when the ohmic contact for the source electrode 9 is formed may be substantially equal to or lower than $\frac{1}{10}$ of the impurity concentration of arsenic in this portion. The reason for this is that, when the impurity concentration of nitrogen in this portion is higher than the impurity concentration of arsenic therein, aggregation of nitrogen occurs, increasing the contact resistance.

A method of manufacturing a semiconductor device according to the first embodiment will be described with reference to FIGS. 1 and 2. The silicon carbide base substrate 10 is manufactured by sequentially forming the $n^-$-type drift layer 2 and the p-type base layer 3 by epitaxial growth on the $n^+$-type supporting substrate including silicon carbide (an $n^+$-type silicon carbide substrate (a semiconductor wafer)) 1. An oxide film not depicted is formed that covers the front surface 10a of the silicon carbide base substrate 10 (the surface on the p-type base layer 3 side). The oxide film is patterned by photolithography to remove a portion of the oxide film corresponding to a formation region of the trench 5.

The remaining portion of the oxide film (a mask oxide film) is used as the mask and etching is performed to form the trench 5 that penetrates the p-type base layer 3 and reaches the $n^-$-type drift layer 2. Soft etching and sacrificial oxidation are performed to remove the layer damaged by the etching. After removing the sacrificial oxide film and the mask oxide film, the front surface 10a of the silicon carbide base substrate 10 is thermally oxidized to form the gate insulating film 6 along the inner wall of the trench 5. The polysilicon (poly-Si) layer is deposited on the front surface 10a of the silicon carbide base substrate 10 and on the gate insulating film 6 to be embedded in the trench 5.

The polysilicon is etched back to the extent that the front surface 10a of the silicon carbide base substrate 10 is exposed and only the polysilicon inside the trench 5 remains to become the gate electrode 7. The gate drop amount tp1 caused by the etching back is, for example, about 0.2 μm. The $n^+$-type source region 4 is selectively formed in the surface region of the p-type base layer 3 by photolithography and ion implantation. At this time, ion implantation of arsenic and ion implantation of nitrogen are sequentially executed to form the $n^+$-type source region 4 having the diffusion depth d1 that is large and having the impurity concentration distribution 20 that results from combining the arsenic concentration profile 21 and the nitrogen concentration profile 22 with each other.

For example, in the ion implantation to form the $n^+$-type source region 4, the ion implantation of nitrogen is executed with an acceleration energy higher than that of the ion implantation of arsenic to thereby control the diffusion depth d1 of the $n^+$-type source region 4. For example, the ion implantation (e.g., one stage) of nitrogen may be performed after a multi-stage ion implantation (e.g., four stages) of arsenic. The order of the ion implantation of arsenic and the ion implantation of nitrogen, and the number of stages of each thereof to form the $n^+$-type source region 4 may be variously changed. For example, the contact resistance with the source electrode 9 is reduced by increasing the concentration of arsenic in the surface region of the $n^+$-type source region 4 by at least the ion implantation of arsenic and therefore, arsenic may be ion-implanted in one stage and nitrogen may be ion-implanted in multiple stages.

The $p^+$-type contact region (not depicted) is selectively formed in the surface region of the p-type base layer 3 by photolithography and ion implantation. The order of formation of the $n^+$-type source region 4 and the $p^+$-type contact region may be interchanged, or these regions may be formed before the formation of the trench 5. The impurities doped by the ion implantation sessions are activated by heat treatment. The heat treatment may be executed after execution of each of the ion implantation sessions for the $n^+$-type source region 4 and the $p^+$-type contact region. The interlayer insulating film 8 is formed on the front surface 10a of the silicon carbide base substrate 10 to fill the upper half portion of the trench 5.

The gate insulating film 6 and the interlayer insulating film 8 on the front surface 10a of the silicon carbide base substrate 10 are patterned to form the contact hole and expose the $n^+$-type source region 4 and the $p^+$-type contact region in the contact hole. The surface of the interlayer insulating film 8 is planarized by heat treatment (reflow). The source electrode 9 is formed on the front surface 10a of the silicon carbide base substrate 10 to be embedded in the contact hole. The drain electrode 11 is formed on the rear surface of the silicon carbide base substrate 10. The semiconductor wafer is thereafter cut (diced) into individual chips. As a result, the vertical MOSFET depicted in FIG. 1 is completed.

As described, according to the first embodiment, the $n^+$-type source region that has the concentration profile of arsenic in the surface region of the front surface of the base substrate and that has the concentration profile of nitrogen in the region relatively deep from the front surface of the base substrate may be formed by performing the ion implantation of arsenic and the ion implantation of nitrogen. As a result, the contact resistance with the source electrode may be reduced and the on-resistance may be reduced by the concentration profile of arsenic in the surface region of the $n^+$-type source region. In addition, the diffusion depth of the $n^+$-type source region may be controlled by the concentration profile of nitrogen in the region relatively deep from the front surface of the base substrate, and the margin of the etching back relative to the gate drop amount may be secured with precision by increasing the diffusion depth of the $n^+$-type source region. As a result, the control margin of the channel length may be secured with precision.

According to the first embodiment, leaks in the vertical direction (the depth direction of the element) may be suppressed by forming the $n^+$-type source region using the ion implantation of arsenic and the ion implantation of nitrogen. According to the first embodiment, the on-resistance may be set to be lower than that in a case where silicon (Si) is used, by producing (manufacturing) the semiconductor device using silicon carbide. According to the first embodiment, it suffices that the contact resistance between the $n^+$-type source region and the source electrode may be reduced by at least the ion implantation of arsenic. As a result, the number of stages of the implantation of arsenic may be set to be fewer and the ion implantation of arsenic may be executed with lower acceleration energy than in cases where the $n^+$-type source region is formed only by the ion implantation of arsenic. As a result, the throughput may be improved and adverse effects on element characteristics caused by the ion implantation of arsenic may be mitigated.

Figure 3:
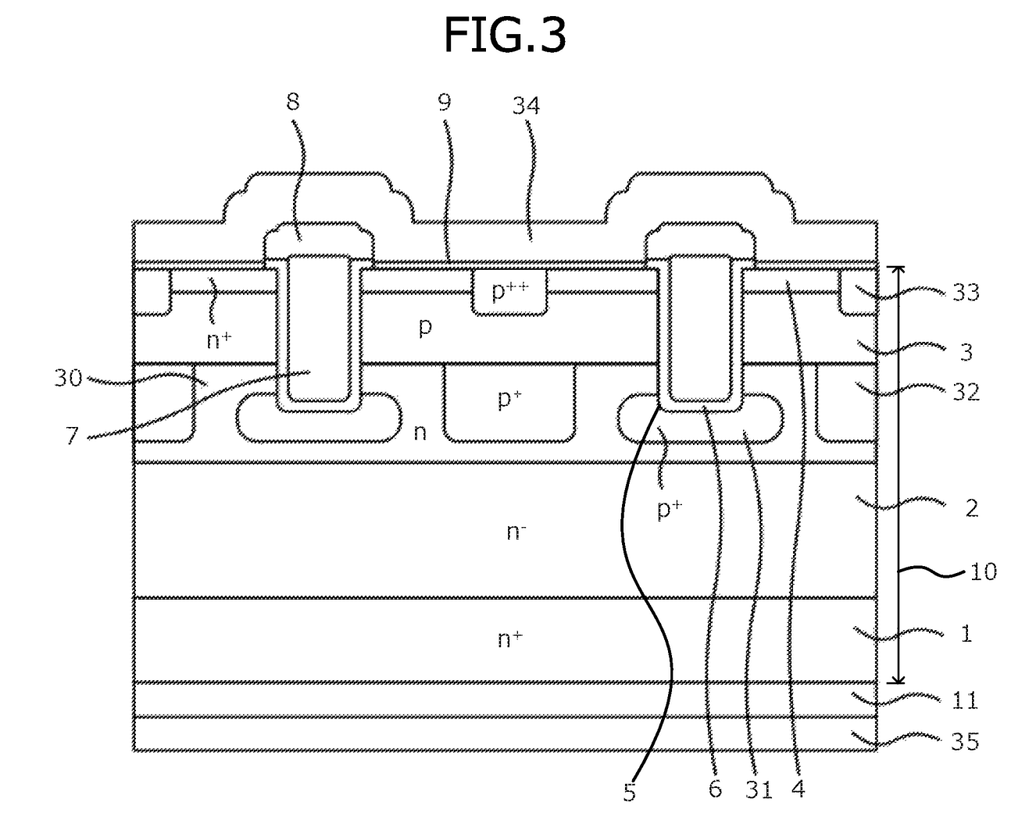
FIG. 3 is a cross-sectional view of a structure of a semiconductor device according to a second embodiment.

In the second embodiment, a specific example of application of the semiconductor device according to the first embodiment will be described. FIG. 3 is a cross-sectional view of a structure of a semiconductor device according to the second embodiment. FIG. 3 depicts only two unit cells (the functional units of the element) and other unit cells adjacent thereto and an edge termination region are not depicted (similarly in FIGS. 4 to 9). The "edge termination region" refers to a region that surrounds a periphery of an active region and mitigates the electric field on the front surface side of the substrate to maintain the breakdown voltage. The "active region" refers to a region through which a current flows during the on-state.

The semiconductor device according to the second embodiment differs from the semiconductor device according to the first embodiment on the following two points. The first difference is that an n-type current spreading region 30 is provided between the n$^-$-type drift layer 2 and the p-type base layer 3. The n-type current spreading region 30 is a so-called current spreading layer (CSL) that reduces the spreading resistance of the carriers. The trench 5 penetrates the n$^+$-type source region 4 and the p-type base layer 3 to reach the n-type current spreading region 30.

The second difference is that first and second p$^+$-type regions 31 and 32 are selectively provided inside the n-type current spreading region 30. The first p$^+$-type region 31 is provided so as to, for example, cover a bottom and a bottom corner portion of the trench 5. The "bottom corner portion" of the trench 5 refers to a border between the bottom and a side wall of the trench 5. The first p$^+$-type region 31 may be arranged at a position separate from the trench 5 so as to face the bottom and the bottom corner portions of the trench 5 in the depth direction. A pn-junction may be formed between the first p$^+$-type region 31 and the n-type current spreading region 30 near the bottom of the trench 5 by providing the first p$^+$-type region 31.

The second p$^+$-type region 32 is provided to be separate from the first pt type region 31 and to be in contact with the p-type base layer 3, between the adjacent trenches 5 (a mesa portion). The second p$^+$-type region 32 is provided spanning from an interface between the p-type base layer 3 and the n-type current spreading region 30 to a depth that does not reach the interface between the n-type current spreading region 30 and the n$^-$-type drift layer 2. A portion of the second p$^+$-type region 32 may extend toward the trench 5 to partially contact the first p$^+$-type region 31. A pn-junction may be formed between the second p$^+$-type region 32 and the n-type current spreading region 30 at a position deeper than the bottom of the trench 5 toward the drain, between the adjacent trenches 5, by providing the second p$^+$-type region 32.

The first and the second p$^+$-type regions 31 and 32 may each be provided at a depth that does not reach the interface of the n-type current spreading region 30 and the n$^-$-type drift layer 2 or the first and the second pt type regions 31 and 32 may reach the interface of the n-type current spreading region 30 and the n$^-$-type drift layer 2. FIG. 3 depicts a state where the first and the second p$^+$-type regions 31 and 32 are each provided at a depth that does not reach the interface of the n-type current spreading region 30 and the n$^-$-type drift layer 2 (similarly in FIGS. 3 and 5 to 9). Application of a high electric field to the portion of the bottom of the trench 5 of the gate insulating film 6 may be prevented by forming the pn-junctions using the first and the second p$^+$-type regions 31 and 32, and the n-type current spreading region 30. In FIG. 3, reference numerals "33" to "35" respectively denote a p$^{++}$-type contact region, a source electrode pad, and a drain electrode pad.

Figure 4:
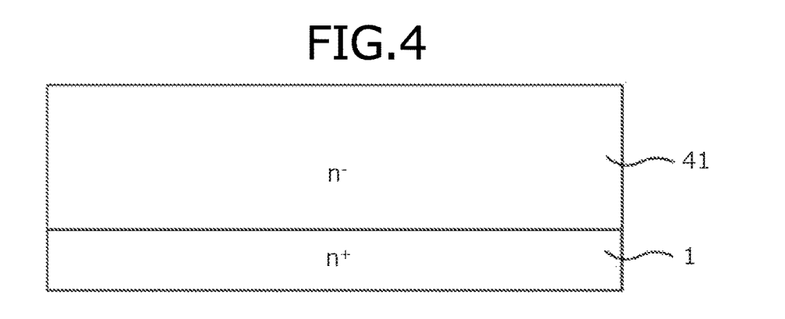
FIGS. 4, 5, 6, 7, 8, and 9 are cross-sectional views of the semiconductor device according to the second embodiment during manufacture.

The method of manufacturing a semiconductor device according to the second embodiment will be described. FIGS. 4, 5, 6, 7, 8, and 9 are cross-sectional views of the semiconductor device according to the second embodiment during manufacture. As depicted in FIG. 4, the n$^+$-type silicon carbide substrate 1 to be the n$^+$-type drain region is prepared. The n$^+$-type silicon carbide substrate 1 may be, for example, a silicon carbide, single crystal substrate doped with nitrogen. The front surface of the n$^+$-type silicon carbide substrate 1 may be, for example, a (0001) surface, a so-call Si surface. An n$^-$-type silicon carbide layer 41 doped with an n-type impurity such as, for example, nitrogen is formed by epitaxial growth on the front surface of the n$^+$-type silicon carbide substrate 1. The impurity concentration and the thickness of the n$^-$-type silicon carbide layer 41 may be, for example, about $3.0 \times 10^{15}/cm^3$ and about 10 μm, respectively.

Figure 5:
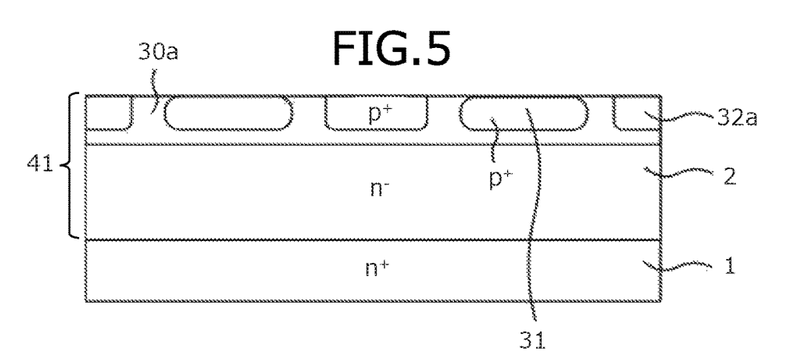

As depicted in FIG. 5, an oxide film (an SiO$_2$ film, not depicted) is formed on the surface of the n$^-$-type silicon carbide layer 41 to have a thickness of, for example, about 1.5 μm by, for example, a plasma chemical vapor deposition (CVD) method. A portion of the oxide film corresponding to a formation region of the first and the second p$^+$-type regions 31 and 32 is removed by photolithography. The remaining portion of the oxide film is used as the mask (an oxide film mask) and an n-type impurity such as aluminum (Al) is ion-implanted to selectively form the first p$^+$-type region 31 and a p$^+$-type region (hereinafter, referred to as "p$^+$-type partial region") 32a each at a depth of, for example, about 1.5 μm in the surface layer of the n$^-$-type silicon carbide layer 41. The p$^+$-type partial region 32a is a portion of the second p$^+$-type region 32. The impurity concentrations of the first p$^+$-type region 31 and the p$^+$-type partial region 32a may each be, for example, about $5.0 \times 10^{18}/cm^3$.

The oxide film mask used in the formation of the first p$^+$-type region 31 and the p$^+$-type partial region 32a is further selectively removed by photolithography to open a portion thereof that corresponds to a formation region of the n-type current spreading region 30. This oxide film mask is used as the mask and an n-type impurity such as nitrogen is ion-implanted to form an n-type region (hereinafter, referred to as "n-type partial region") 30a in the surface layer of the n$^-$-type silicon carbide layer 41. The n-type partial region 30a is a portion of the n-type current spreading region 30. The impurity concentration of the n-type partial region 30a may be, for example, about $1.0 \times 10^{17}/cm^3$. The depth of the n-type partial region 30a may be equal to the depth of the first p$^+$-type region 31 and the p$^+$-type partial region 32a, or may be deeper than that of the first p$^+$-type region 31 and the p$^+$-type partial region 32a.

A portion of the n$^-$-type silicon carbide layer 41 closer than the n-type partial region 30a to the drain, acts as the n$^-$-type drift layer 2. The oxide film mask used in the formation of the n-type partial region 30a, the first p$^+$-type region 31, and the p$^+$-type partial region 32a is removed. The first p$^+$-type region 31 and the p$^+$-type partial region 32a may each be formed at an ion implantation step different from that of each other, using an oxide film mask different from that of each other. The order of formation of the n-type partial region 30a, the first p$^+$-type region 31, and the p$^+$-type partial region 32a may be interchanged.

Figure 6:
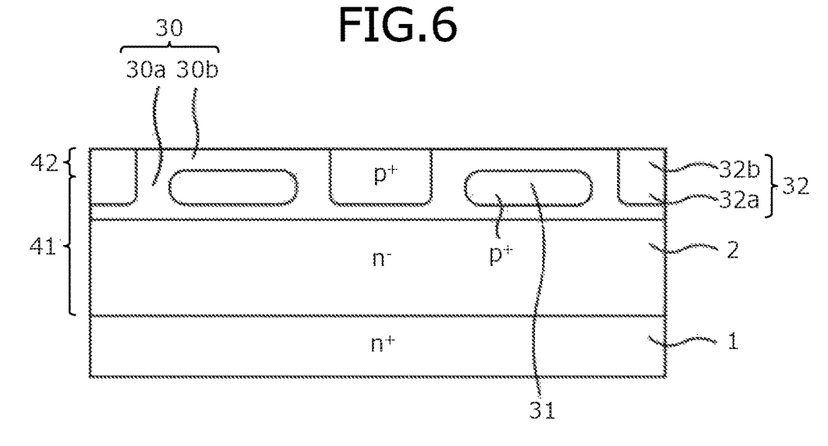

As depicted in FIG. 6, an n$^-$-type silicon carbide layer 42 is formed by epitaxial growth on the n$^-$-type silicon carbide layer 41 doped with an n-type impurity such as nitrogen. The impurity concentration and the thickness of the n$^-$-type silicon carbide layer 42 may be, for example, about $3.0 \times 10^{15}/cm^3$ and about 0.5 μm, respectively. An oxide film (not depicted) is formed to have a thickness of, for example, about 1.5 μm on the surface of the n$^-$-type silicon carbide layer 42 by, for example, a plasma CVD method. A portion of the oxide film corresponding to the formation region of the second p$^+$-type region 32 is removed by photolithography.

The remaining portion of the oxide film is used as the mask (the oxide film mask) and a p-type impurity such as aluminum (Al) is ion-implanted to selectively form a $p^+$-type partial region 32b to at a depth reaching the $p^+$-type partial region 32a (i.e., about 0.5 μm) in the portion of the $n^-$-type silicon carbide layer 42 facing the $p^+$-type partial region 32a in the depth direction. The width and the impurity concentration of the $p^+$-type partial region 32b are, for example, substantially equal to those of the $p^+$-type partial region 32a. The $p^+$-type partial regions 32a and 32b are joined to each other in the depth direction (in the vertical direction), forming the second $p^+$-type region 32.

The oxide film mask used in the formation of the $p^+$-type partial region 32b is further selectively removed by photolithography to open a portion thereof that corresponds to the formation region of the n-type current spreading region 30. This oxide film mask is used as a mask and an n-type impurity such as nitrogen is ion-implanted to form an n-type partial region 30b at a depth to reach the n-type partial region 30a (i.e., about 0.5 μm) in the surface layer of the $n^-$-type silicon carbide layer 42. The impurity concentration of the n-type partial region 30b may be substantially equal to that of the n-type partial region 30a. Joining at least a portion of each of the n-type partial regions 30a and 30b to each other in the depth direction forms the n-type current spreading region 30. The oxide film mask used in the formation of the $p^+$-type partial region 32b and the n-type partial region 30b is removed. The order of the formation of the $p^+$-type partial region 32b and the n-type partial region 30b may be interchanged.

Figure 7:
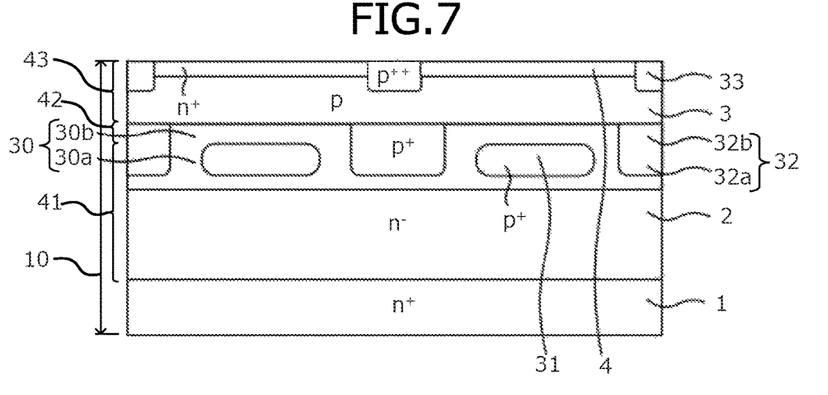

As depicted in FIG. 7, a p-type silicon carbide layer 43 doped with a p-type impurity such as aluminum is formed by epitaxial growth on the $n^-$-type silicon carbide layer 42. The impurity concentration and the thickness of the p-type silicon carbide layer 43 may be, for example, about $4.0 \times 10^{17}/cm^3$ and about 1.3 μm, respectively. The silicon carbide base substrate (the semiconductor wafer) 10 in which the $n^-$-type silicon carbide layers 41 and 42, and the p-type silicon carbide layer 43 are sequentially stacked on the $n^+$-type silicon carbide substrate 1 is formed by the steps executed so far.

A resist mask (not depicted) opened at portion corresponding to the formation region of the edge termination region (not depicted) is formed on the front surface of the silicon carbide base substrate 10 (the surface on the p-type silicon carbide layer 43 side) by photolithography. This resist mask is used as a mask and dry etching is performed using a fluorine-based gas such as sulfur hexafluoride ($SF_6$) to remove the p-type silicon carbide layer 43 in the edge termination region to expose the $n^-$-type silicon carbide layer 42. The p-type silicon carbide layer 43 is exposed in the active region and the $n^-$-type silicon carbide layer 42 is exposed in the edge termination region, on the front surface of the silicon carbide base substrate 10. The resist mask for the etching is removed.

An oxide film (not depicted) is formed on the front surface of the silicon carbide base substrate 10 to have a thickness of, for example, about 1.5 μm by, for example, the plasma CVD method. A portion of the oxide film corresponding to the formation region of the $n^+$-type source region 4 is removed by photolithography. The remaining portion of the oxide film is used as the mask (the oxide film mask), similar to the first embodiment, ion implantation of arsenic and ion implantation of nitrogen are sequentially executed to selectively form in the surface layer of the p-type silicon carbide layer 43, the $n^+$-type source region 4 having the impurity concentration distribution 20 and the diffusion depth d1 that is large (see FIG. 2). The oxide film mask used in the formation of the $n^+$-type source region 4 is removed.

An oxide film (not depicted) is formed on the front surface of the silicon carbide base substrate 10 to have a thickness of, for example, about 1.5 μm by, for example, a plasma CVD method. A portion of the oxide film corresponding to the formation region of the $p^{++}$-type contact region 33 is removed by photolithography. The remaining portion of the oxide film is used as a mask (an oxide film mask) and a p-type impurity such as aluminum is ion-implanted to selectively form the $p^{++}$-type contact region 33 in the surface layer of the p-type silicon carbide layer 43. The impurity concentration of the $p^{++}$-type contact region 33 is set to be, for example, higher than the impurity concentration of the p-type silicon carbide layer 43. The oxide film mask used in the formation of the $p^{++}$-type contact region 33 is removed.

An oxide film (not depicted) is formed on the front surface of the silicon carbide base substrate 10 to have a thickness of, for example, about 1.5 μm by, for example, a plasma CVD method. A portion of the oxide film corresponding to the formation region of a breakdown voltage structure in the edge termination region is removed by photolithography. The remaining portion of the oxide film is used as a mask (an oxide film mask) and a p-type impurity such as aluminum is ion-implanted to selectively form the $p^-$-type region (not depicted) constituting the voltage breakdown voltage structure.

The $p^-$-type region constituting the voltage breakdown voltage structure contacts the p-type base layer 3 and may be formed in only the surface layer of the $n^-$-type silicon carbide layer 42 in the edge termination region, or may be formed spanning from a step between the p-type silicon carbide layer 43 and the $n^-$-type silicon carbide layer 42, to the $n^-$-type silicon carbide layer 42. The oxide film mask used in the formation of the voltage breakdown voltage structure is removed. The order of the formation of the $n^+$-type source region 4, the $p^{++}$-type contact region 33, and the voltage breakdown voltage structure may be interchanged.

Figure 8:
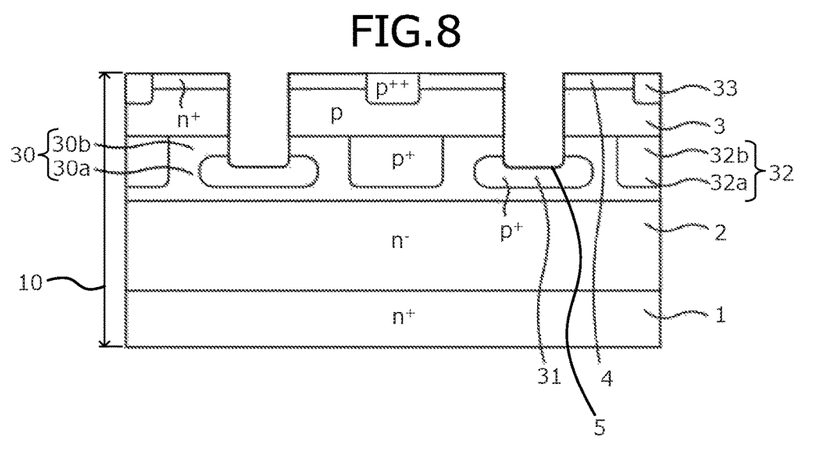

Heat treatment is performed, for example, at a temperature of about 1700 degrees C. and in an inert gas atmosphere to activate all the regions formed by ion implantation. As depicted in FIG. 8, an oxide film (not depicted) is formed on the front surface of the silicon carbide base substrate 10 to have a thickness of, for example, about 1.5 μm by, for example, a plasma CVD method. A portion of the oxide film corresponding to the formation region of the trench 5 is removed by photolithography. The remaining portion of the oxide film is used as a mask (an oxide film mask) and dry etching is performed to form the trench 5 that penetrates the $n^+$-type source region 4 and the p-type base layer 3 to reach the n-type current spreading region 30. The trench 5 may reach the first $p^+$-type region 31 inside the n-type current spreading region 30. The oxide film mask used in the formation of the trench 5 is removed.

Figure 9:
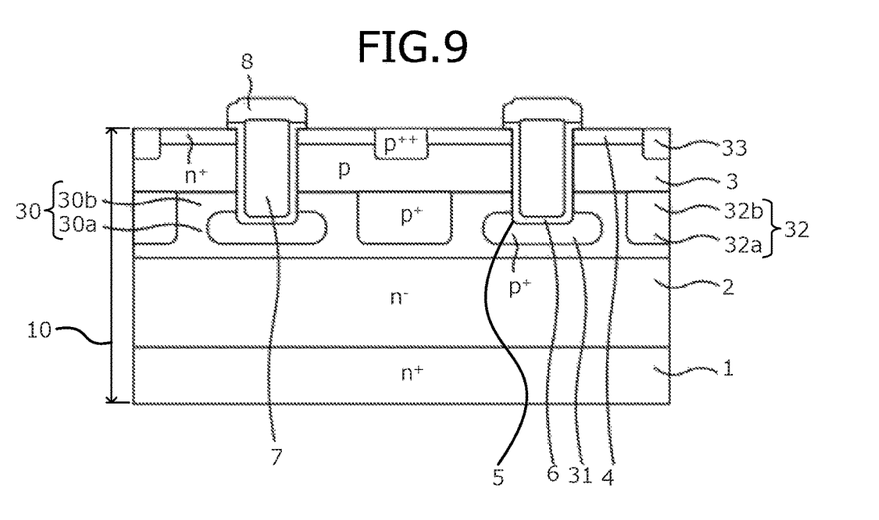

As depicted in FIG. 9, the gate insulating film 6 is formed along the front surface of the silicon carbide base substrate 10 (the surface of the p-type silicon carbide layer 43) and the inner wall of the trench 5. The gate insulating film 6 may be a thermal oxide film formed by heat treatment, for example, at a temperature of about 1,000 degrees C. in an oxygen ($O_2$) atmosphere, may be a film deposited by a plasma CVD method, or may be a high temperature oxide (HTO) film formed by a vapor deposition method.

Polysilicon (poly-Si) having, for example, been doped with phosphorus is deposited to fill the trench 5 and is etched so that the poly-silicon remains inside the trench 5 to form the gate electrode 7. The gate electrode 7 may protrude outward from the front surface of the silicon carbide base substrate 10. The interlayer insulating film 8 is formed to have a thickness of, for example, about 1 μm on the overall front surface of the silicon carbide base substrate 10 to cover the gate electrode 7. The interlayer insulating film 8 is formed using, for example, phosphorus silicate glass (PSG).

The interlayer insulating film 8 and the gate insulating film 6 are patterned by photolithography and etching to form a contact hole exposing the n$^+$-type source region 4 and the p$^{++}$-type contact region 33. The interlayer insulating film 8 is planarized by heat treatment (reflow). A conductive film such as a nickel (Ni) film to be the source electrode 9 is formed to contact the n$^+$-type source region 4 and the p$^{++}$-type contact region 33. The conductive film is patterned by photolithography and etching so that the conductive film remains only in the contact hole.

Another conductive film such as a nickel film to be the drain electrode 11 is formed on the rear surface of the silicon carbide base substrate 10 (the rear surface of the n$^+$-type silicon carbide substrate 1). The conductive films on both sides of the silicon carbide base substrate 10 are each converted into a silicide by heat treatment performed, for example, at a temperature of about 1000 degrees C. in an inert gas atmosphere, to form the source electrode 9 and the drain electrode 11 each forming an ohmic contact with the silicon carbide base substrate 10.

An aluminum film is deposited on the surface of the interlayer insulating film 8 by, for example, a sputtering method to have a thickness of, for example, about 5 μm to fill the contact hole. The aluminum film is patterned by photolithography and etching so that the aluminum film to be the source electrode pad 34 remains in the active region. For example, a titanium (Ti) film, a nickel film, and a gold (Au) film are sequentially stacked on the drain electrode 11 by, for example, a sputtering method to form the drain electrode pad 35. The MOSFET depicted in FIG. 3 is thus completed.

As described, according to the second embodiment, effects similar to those of the first embodiment may be achieved.

Various changes may be made in the embodiments above within a scope not departing from the spirit of the present invention. In the embodiments, for example, the dimensions, the impurity concentrations, and the like of the components are variously set according to a required specification or the like. Although the embodiments have been described taking a MOSFET as an example, similar effects are also achieved in a case where the present invention is applied to MOS semiconductor devices having a trench gate structure, such as an insulated gate bipolar transistor (IGBT). Although the embodiments have been described taking an example of a semiconductor device that uses silicon carbide, similar effects are also achieved in a case where the present invention is applied to semiconductor devices using silicon, or a wide bandgap semiconductor (a semiconductor whose bandgap is wider than that of silicon) other than silicon carbide such as, for example, gallium nitride (GaN).

According to the above invention, the semiconductor region of the first conductivity type may be formed to have an arsenic concentration profile in the surface region of the front surface of the base substrate and to have a nitrogen concentration profile in the region that is relatively deep from the front surface of the base substrate. As a result, the contact resistance with the first electrode may be reduced and the on-resistance may be reduced by the arsenic concentration profile in the surface region of the semiconductor region of the first conductivity type. In addition, the diffusion depth of the semiconductor region of the first conductivity type may be controlled by the nitrogen concentration profile in the region relatively deep from the front surface of the base substrate, and the margin of the etching back relative to the gate drop amount may be secured with precision by increasing the diffusion depth of the semiconductor region of the first conductivity type. Therefore, the control margin of the channel length may be secured with precision. According to the above invention, leaks in the vertical direction (the depth direction of the element) may be suppressed by forming the semiconductor region of the first conductivity type by the ion implantation of arsenic and the ion implantation of nitrogen.

According to the semiconductor device and the method of manufacturing a semiconductor device of the present invention, an effect is achieved in that the on-resistance may be reduced, the channel length may be controlled with precision, and leaks may be suppressed.

As described, the semiconductor device and the method of manufacturing a semiconductor device according to the present invention are useful for a semiconductor device that includes a trench gate structure and are especially suitable for a semiconductor device that uses silicon carbide.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device, comprising:
   a semiconductor substrate;
   a first semiconductor layer of a first conductivity type provided on a front surface of the semiconductor substrate;
   a second semiconductor layer of a second conductivity type provided on a surface on a first side of the first semiconductor layer opposite a second side of the first semiconductor layer facing the semiconductor substrate;
   a semiconductor region of the first conductivity type selectively provided in the second semiconductor layer;
   a trench that penetrates the semiconductor region of the first conductivity type and the second semiconductor layer to reach the first semiconductor layer;
   a gate electrode provided in the trench, on a gate insulating film;
   a first electrode contacting the semiconductor region of the first conductivity type and the second semiconductor layer; and
   a second electrode provided on a rear surface of the semiconductor substrate, wherein
   the semiconductor region includes
      a first region having a first impurity concentration distribution of arsenic, and
      a second region having a second impurity concentration distribution of nitrogen,
   the first region overlapping the second region, an upper side of the second region being closer than an upper side of the first region to the second electrode,
   a negative slope of an impurity concentration from the peak of the second impurity concentration distribution toward the second electrode being steeper than a negative slope of an impurity concentration from the peak of the first impurity concentration distribution toward the second electrode entirely in the first region.

2. The semiconductor device according to claim 1, wherein a peak of the second impurity concentration distribution is positioned closer than a peak of the first impurity concentration distribution to the second electrode.

3. The semiconductor device according to claim 1, wherein the first impurity concentration distribution in the first region and the second impurity concentration distribution in the second region are variable in a direction perpendicular to the front surface of the semiconductor substrate, the first region and the second region entirely overlapping each other in a plan view and at least partially overlapping each other in a side view.

4. A semiconductor device comprising:
a semiconductor substrate having a front surface and a rear surface opposite to the front surface;
a first semiconductor layer of a first conductivity type provided on the front surface of the semiconductor substrate, and having a front side and a second side opposite to the front side, the second side of the first semiconductor layer facing the front surface of the substrate;
a second semiconductor layer of a second conductivity type provided on the first side of the first semiconductor layer;
a semiconductor region of the first conductivity type selectively provided in the second semiconductor layer, and having a first side and a second side opposite to the first side, an entire area of the second side of the semiconductor region forming a p-n junction with the second semiconductor layer, the semiconductor region including a first region having a first impurity concentration distribution of arsenic and a second region having a second impurity concentration distribution of nitrogen, a negative slope of an impurity concentration from the peak of the second impurity concentration distribution toward the second electrode being steeper than a negative slope of an impurity concentration from the peak of the first impurity concentration distribution toward the second electrode entirely in the first region;
a trench that penetrates the semiconductor region of the first conductivity type and the second semiconductor layer to reach the first semiconductor layer;
a gate electrode provided in the trench, on a gate insulating film;
a first electrode contacting the semiconductor region of the first conductivity type and the second semiconductor layer; and
a second electrode provided on the rear surface of the semiconductor substrate.

5. The semiconductor device according to claim 4, wherein a peak of the second impurity concentration distribution is positioned closer than a peak of the first impurity concentration distribution to the second electrode.

* * * * *